United States Patent [19]
Ackley

[11] Patent Number: 5,337,327
[45] Date of Patent: Aug. 9, 1994

[54] VCSEL WITH LATERAL INDEX GUIDE

[75] Inventor: Donald E. Ackley, Lambertville, N.J.

[73] Assignee: Motorola, Inc., Schaumburg, Ill.

[21] Appl. No.: 20,959

[22] Filed: Feb. 22, 1993

[51] Int. Cl.$^5$ ............................................... H01S 3/19
[52] U.S. Cl. ........................................ 372/45; 372/46; 372/92
[58] Field of Search ............................. 372/45, 92, 46

[56] References Cited

U.S. PATENT DOCUMENTS

| | | | |
|---|---|---|---|
| 5,206,872 | 4/1993 | Jewell et al. | 372/46 |
| 5,245,622 | 9/1993 | Jewell et al. | 372/45 |
| 5,256,596 | 10/1993 | Ackley et al. | 372/45 X |

Primary Examiner—James W. Davie
Attorney, Agent, or Firm—Eugene A. Parsons

[57] ABSTRACT

A VCSEL including a first mirror stack, an active region and a second mirror stack positioned on a substrate having a surface lying in a first plane and a centrally located offset area of the surface lying in a second plane parallel to the first plane and spaced therefrom. Portions of the active region and the first and second mirror stacks being offset from surrounding portions by the offset area in the surface of the substrate so as to define a lateral waveguide which confines the operating region of the VCSEL.

6 Claims, 2 Drawing Sheets

VCSEL WITH LATERAL INDEX GUIDE

FIELD OF THE INVENTION

The present invention pertains to vertical cavity surface emitting lasers and more specifically to high efficiency vertical cavity surface emitting lasers.

BACKGROUND OF THE INVENTION

In general, vertical cavity surface emitting lasers (VCSEL) are constructed by providing a substrate with very smooth surface. A first stack of mirrors is then grown on the surface by semiconductor manufacturing techniques. An active area is grown on the upper surface of the first mirror stack and a second mirror stack is grown on the upper surface of the active area. Generally, one metal contact is provided on the reverse surface of the substrate and a second metal contact is provided on the upper surface of the second mirror stack.

The major problems that occur are to contain the lasing, or optical mode to a lowest order mode and to contain current flow to approximately the volume of the VCSEL in which lasing is occurring. Higher order lasing and extraneous flow of current outside the lasing area produces heat in the VCSEL and causes a substantial loss of power and efficiency.

SUMMARY OF THE INVENTION

It is a purpose of the present invention to provide a VCSEL which is more efficient than prior VCSELs.

It is a further purpose of the present invention to provide a VCSEL with improved modal confinement.

The above problems and others are substantially solved and the above purposes and others realized by a vertical cavity surface emitting laser having an operating frequency at which light emission occurs, the laser including a supporting substrate having a surface lying in a first plane and a substantially centrally located offset area of the surface lying in a second plane parallel to the first plane and spaced therefrom, a first mirror stack positioned on the surface of the substrate so as to overlie the offset area and a portion of the surface surrounding the offset area, an active region including at least a layer positioned parallel and in overlying abutting engagement with the first mirror stack and substantially coextensive therewith, a second mirror stack positioned parallel and in overlying abutting engagement with the active region and substantially coextensive therewith, and first portions of the active region and the first and second mirror stacks being offset from second surrounding portions of the active region and the first and second mirror stacks by the offset area in the surface of the substrate so as to define a lateral waveguide.

Further, the above problems and others are substantially solved and the above purposes and others realized by a method of manufacturing a vertical cavity surface emitting laser having an operating frequency at which light emission occurs, the method including the steps of providing a supporting substrate having a surface lying in a first plane, forming a substantially centrally located offset area in the surface lying in a second plane parallel to the first plane and spaced therefrom, positioning a first mirror stack on the surface of the substrate so as to overlie the offset area and a portion of the surface surrounding the offset area, positioning an active region including at least a layer parallel and in overlying abutting engagement with the first mirror stack and substantially coextensive therewith, positioning a second mirror stack parallel and in overlying abutting engagement with the active region and substantially coextensive therewith, and further positioning the first mirror stack, the active region and the second mirror stack so that first portions of the active region and the first and second mirror stacks are offset from second surrounding portions of the active region and the first and second mirror stacks by the offset area in the surface of the substrate so as to define a lateral waveguide.

BRIEF DESCRIPTION OF THE DRAWINGS

Referring to the drawings.

DESCRIPTION OF THE PREFERRED EMBODIMENT

Figure 1:
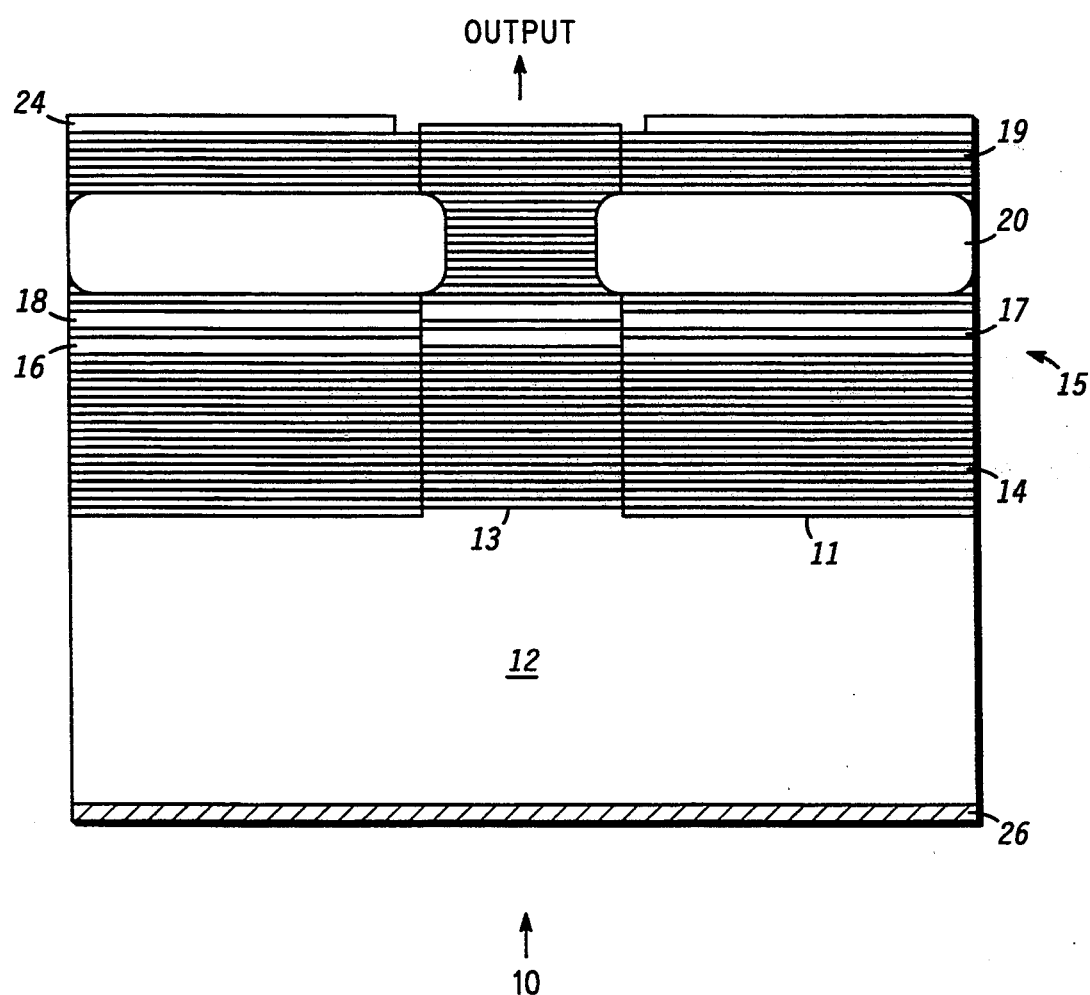
FIG. 1 is a first embodiment of a VCSEL embodying the present invention.

Referring specifically to FIG. 1, a vertical cavity surface emitting laser (VCSEL) 10 is illustrated in a sectional view. VCSEL 10 is formed on a substrate 12, which in this example, is made of n-doped gallium arsenide. Gallium arsenide is used as substrate 12 to facilitate epitaxial growth of multiple layers of aluminum gallium arsenide and aluminum arsenide. It should be understood that VCSEL 10 and substrate 12 are simply utilized for illustrative purposes and many other lasers and other semiconductor substrates could be used.

Substrate 12 has an upper surface 11 on which the active portions of VCSEL 10 are positioned. Prior to positioning the active portions on substrate 10, surface 11 of substrate 10 is etched to form a mesa 13. While etching is a preferred method of forming mesa 13, it should be understood that other methods might be utilized with the important feature being that the surface of mesa 13 lie generally in a plane parallel with a plane through surface 11 but spaced, or offset, therefrom. In this specific embodiment, mesa 13 is round and has a diameter approximately equal to the mode size for the lowest order of operating mode for VCSEL 10. For reasons which will be explained presently, the height of mesa 13, or the amount that the surface of mesa 13 is offset from surface 11, is approximately a quarter of the operating wavelength in the semiconductor layers of VCSEL 10. As will be understood from the following explanation, the offset can be any desired odd multiple of one quarter wavelength, but a single one quarter wavelength is chosen here for simplicity of construction and understanding.

Epitaxial deposition of multiple alternate layers of different compositions is accomplished by well known techniques in the art such as MBE, MOCVD, or the like. These techniques enable epitaxial deposition of relatively thin and thick layers of a variety of materials such as gallium arsenide, aluminum gallium arsenide, aluminium arsenide, indium phosphide or the like. Fabrication of VCSEL devices use epitaxial deposition extensively to produce the multitude of layers of different materials which make up the device.

Deposition of alternating layers of doped aluminum gallium arsenide and aluminum arsenide form a first stack 14 of reflectors or mirrors for VCSEL 10. First stack 14 is positioned so as to overlie mesa 13 and a surrounding portion of surface 11. Thicknesses of alternating layers of aluminum gallium arsenide and aluminum arsenide are set at approximately one quarter of the wavelength at which the device is designed to operate. Nominal thicknesses for the aluminum gallium arsenide layers and the aluminum arsenide layers are on the order of 605 angstroms and 645 angsttoms, respectively. First mirror stack 14 is typically n-doped with dopants well known in the art, such as Se or Si.

A typical active region 15 is formed as follows, so as to overlie first stack 14 and be approximately coextensive therewith. A first cladding layer 16 is epitaxially deposited on first mirror stack 14 to form a first major surface of active region 15. Cladding layer 16 is typically composed of aluminum gallium arsenide of composition intermediate to the two compositions used in first mirror stack 14. An active layer 17, which consists of a single GaAs quantum well (or multiple GaAs quantum wells separated by 100A barriers of aluminum gallium arsenide) is then epitaxially deposited on cladding layer 16. A second cladding layer 18 of the same aluminum gallium arsenide composition and thickness as cladding layer 16 is then deposited on active layer 17. The total thickness of active region 15 is chosen to be an integral multiple of a half wavelength of the optical emission in the semiconductor material.

A second stack 19 of reflectors or mirrors is epitaxially deposited on the surface of second cladding layer 18 of active region 15 so as to be approximately coextensive therewith. Second mirror stack 19 is composed of alternating layers of p-doped aluminum gallium arsenide and aluminum arsenide, typical p-dopant includes Be or C. Thickness of the last alternating layer is approximately one half wave length instead of one quarter wave length as is used for the other alternating layers. Generally, the threshold current of a VCSEL is reduced by increasing the number of alternating layers in mirror stacks 14 and 19.

Using growth techniques, such as MOCVD or MBE, well known in the art, each of first mirror stack 14, active region 15 and second mirror stack 18 generally follow the contours of surface 11 and mesa 13 which they overlie. Thus, each layer in first mirror stack 14, active region 15 and second mirror stack 19 includes an offset of approximately one quarter wavelength directly above the edges, or outer limit, of mesa 13. Since each layer in first and second mirror stacks 14 and 19 is approximately one quarter wavelength thick, the portion of each layer which overlies mesa 13 is substantially aligned with, or bounded by, the portion of the next succeeding layer which overlies surface 11 surrounding mesa 13. Further, alternating layers of aluminum gallium arsenide and aluminum arsenide are used to form mirror stacks 14 and 19. Thus, for example, each layer of aluminum gallium arsenide is bounded at the offset by the next layer of aluminum arsenide and each layer of aluminum arsenide is bounded at the offset by the next layer of aluminum gallium arsenide.

Aluminum arsenide has an index of refraction of approximately 3.3 and aluminum gallium arsenide of the appropriate mole fraction has an index of refraction of approximately 3.5. Each layer of aluminum gallium arsenide with a high index of refraction is bounded by aluminum arsenide with a low index of refraction. This change in the index of refraction at the offset results in virtually total internal reflection of light. While the low index of refraction layers are bounded by high index of refraction material, the high angle reflectivity is still greater than approximately 80%. Further, active layer 17 is offset so that it is bounded by cladding layer 18, which results in virtually total internal reflection of light at the source. Thus, the offset in each layer produced by mesa 13 essentially produces a built-in lateral waveguide that extends from the junction of mesa 13 and surface 12 to the upper surface of second mirror stack 19. From a mode picture, the peaks of the optical field outside of the offset region no longer line up properly with active layer 17 or the mirror interface, leading to modal confinement due to the phase and gain mismatches. Thus, the change in the index of refraction at the offset, which defines the built-in lateral waveguide, also substantially defines the operating volume in which lasing occurs.

A deep implant of an impurity or doping material, such as hydrogen (H+), etc., is made in second mirror stack 19 to form a buried implant layer 20 in the non-lasing volume of second mirror stack 19. The impurity may be chosen to produce a conductivity type different from the conductivity of second mirror stack 19, or to form a high resistivity region. In the specific embodiment illustrated, second mirror stack 18 has p-type conductivity and implant layer 20 has high resistivity. Further, in this specific embodiment hydrogen (H+) is used as the impurity to achieve the deepest buried implant because it is the lightest generally used impurity. However, it will be understood that any of the well known implant materials commonly utilized in the semiconductor industry can be utilized as implant 20. Thus, a buried high resistance structure is formed in the non-lasing volume of second mirror stack 19 to prevent current flow therethrough.

Implant layer 20 substantially confines current flow within VCSEL 10 to the lasing volume generally coaxial with and above mesa 13. Also, the volume above mesa 13 generally defines the volume of VCSEL 10 within which lasing occurs because of the change in index of refraction produced by the offset between mesa 13 and surface 11. By controlling the dimensions of the implant mask, the current distribution is chosen to overlap only the desired lasing volume, in which case a minimum of current is wasted and the efficiency of VCSEL 10 is maximized.

After the implanting step, VCSEL 10 is patterned for p-metalization lift-off and bonding pads, represented by a metal layer 24. A second metal layer 26 is deposited on the lower surface of VCSEL 10, which in this embodiment is the lower surface of substrate 12, to form a second electrical contact. Typically, metal layers 24 and 26 are made of titanium, platinum, gold, while layer 26 may be nickel, germanium, gold. Metal layers 24 and 26 are fabricated so that geometric patterns are formed by using a common liftoff process. It should be understood that other masking structures and methods could be used to fabricate geometric patterns such as etching, dielectrics isolation or the like.

Figure 2:
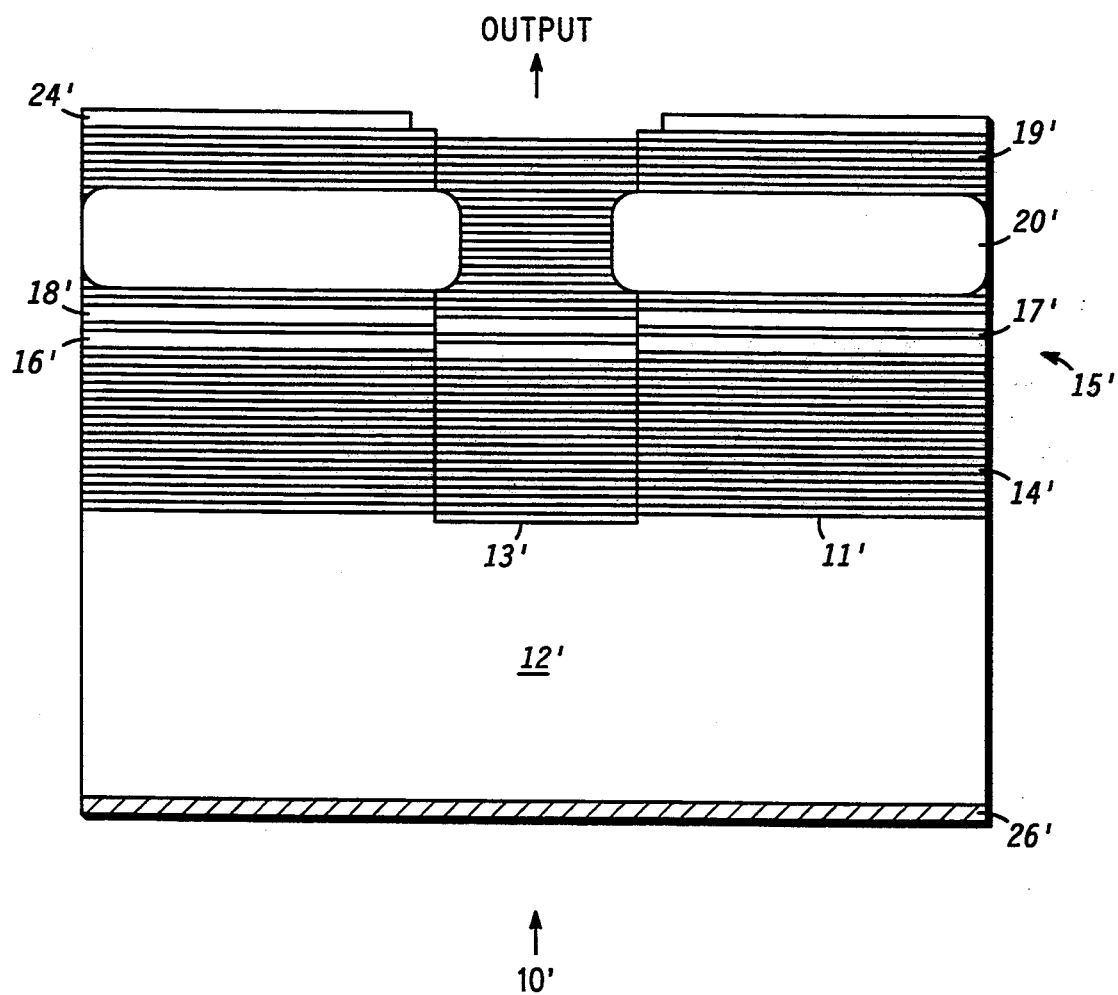
FIG 2 is a second embodiment of a VCSEL embodying the present invention.

Referring to FIG. 2, a second embodiment of a VCSEL 10' in accordance with the present invention is illustrated. In FIG. 2, components similar to those in FIG. 1 are designated with similar numbers, having a prime added to indicate the different embodiment. VCSEL 10' is substantially similar to VCSEL 10, with a built in lateral waveguide produced by an offset in each of the layers, except that the offset in VCSEL 10' is produced by forming a depression 13' in surface 11' of substrate 12' instead of mesa 13. The diameter of depression 13' is approximately equal to the mode size for the lowest order of operating mode for VCSEL 10' and the depth is approximately one quarter wavelength (or an odd multiple thereof) at the operating frequency of VCSEL 10'.

Thus, a VCSEL which is more efficient than prior VCSELs is disclosed. Further, a VCSEL with improved modal confinement is disclosed, which modal confinement, along with current confinement provides the improved efficiency and stable output characteristics. The modal confinement is provided by a built in lateral waveguide which significantly alleviates problems with dynamic waveguiding formed by a combination of gain, refractive index depression and thermal effects. The dynamic waveguiding leads to problems with a relatively long delay in lasing during pulse operation of the VCSEL, which long delay is substantially eliminated by the built in lateral waveguide.

While I have shown and described specific embodiments of the present invention, further modifications and improvements will occur to those skilled in the art. I desire it to be understood, therefore, that this invention is not limited to the particular forms shown and I intend in the append claims to cover all modifications that do not depart from the spirit and scope of this invention.

What is claimed is:

1. A vertical cavity surface emitting laser having an operating wavelength at which light emission occurs, the laser comprising:

a supporting substrate having a surface lying in a first plane and a substantially centrally located offset area of the surface lying in a second plane parallel to the first plane and spaced therefrom;

a first mirror stack positioned on the surface of the substrate so as to overlie the offset area and a portion of the surface surrounding the offset area;

an active region including at least a layer positioned parallel and in overlying abutting engagement with the first mirror stack and substantially coextensive therewith;

a second mirror stack positioned parallel and in overlying abutting engagement with the active region and substantially coextensive therewith; and first portions of the active region and the first and second mirror stacks being offset from second surrounding portions of the active region and the first and second mirror stacks by the offset area in the surface of the substrate so as to define a lateral waveguide.

2. A vertical cavity surface emitting laser as claimed in claim 1 wherein the active region includes an active layer with overlying cladding layers positioned in abutting engagement on opposite sides thereof, the offset being large enough to position one of the cladding layers in the second surrounding portions in the same plane as the active layer in the first portion.

3. A vertical cavity surface emitting laser as claimed in claim 1 wherein the active region, including the active layer with overlying cladding layers, has a thickness of approximately a multiple of a half wavelength at the operating frequency.

4. A vertical cavity surface emitting laser as claimed in claim 1 wherein the offset is approximately an odd multiple of a quarter of the operating wavelength of the laser in the first and second mirror stacks.

5. A vertical cavity surface emitting laser as claimed in claim 1 wherein the offset is a mesa formed in the surface of the supporting substrate.

6. A vertical cavity surface emitting laser as claimed in claim 1 wherein the offset is a depression formed in the surface of the supporting substrate.

* * * * *